United States Patent [19]

Kamisaka et al.

[11] Patent Number: 5,424,775
[45] Date of Patent: Jun. 13, 1995

[54] SOLID-STATE IMAGE PICKUP DEVICE AND METHOD OF MANUFACTURING THE SAME

[75] Inventors: Wataru Kamisaka, Takatsuki; Hiroyuki Okada, Osaka; Yasuyuki Deguchi, Nagaokakyo, all of Japan

[73] Assignee: Matsushita Electronics Corporation, Osaka, Japan

[21] Appl. No.: 257,477

[22] Filed: Jun. 9, 1994

Related U.S. Application Data

[63] Continuation of Ser. No. 847,925, Mar. 6, 1992, abandoned.

[30] Foreign Application Priority Data

Mar. 6, 1991 [JP] Japan .................................. 3-039994

[51] Int. Cl.⁶ .......................................... H04N 5/335
[52] U.S. Cl. .................................. 348/311; 257/232; 257/639; 257/640
[58] Field of Search ............... 348/294, 302, 303, 304, 348/311, 316; 257/232, 249-250, 639, 640, 649; H04N 5/335

[56] References Cited

U.S. PATENT DOCUMENTS

| | | | |
|---|---|---|---|
| 3,865,652 | 2/1975 | Agusta | 257/249 |
| 3,911,560 | 10/1975 | Amelio et al. | 257/249 |
| 4,319,261 | 3/1982 | Kub | 257/249 |
| 4,618,878 | 10/1986 | Aoyaka et al. | 257/640 |
| 4,831,426 | 5/1989 | Kimata et al. | 257/233 |
| 4,954,867 | 9/1990 | Hosaka | 257/639 |
| 5,077,592 | 12/1991 | Janesick | 257/231 |
| 5,321,282 | 6/1994 | Taguchi | 257/640 |

FOREIGN PATENT DOCUMENTS

| | | | |
|---|---|---|---|
| 265271 | 4/1988 | European Pat. Off. | H01L 27/14 |
| 285084 | 10/1988 | European Pat. Off. | H01L 27/14 |
| 61-203670 | 9/1986 | Japan | H01L 27/14 |
| 63-44761 | 2/1988 | Japan | H01L 27/14 |
| 1253268 | 9/1989 | Japan | H01L 27/14 |
| 1064355 | 10/1989 | Japan | H01L 27/14 |
| WO90/02418 | 3/1990 | WIPO | H01L 31/0216 |

Primary Examiner—Michael T. Razavi
Assistant Examiner—Tuan V. Ho
Attorney, Agent, or Firm—Ratner & Prestia

[57] ABSTRACT

A p type well is formed on a silicon substrate. An n⁻ type region forming a photo diode is formed in the p type well. A p type region is also formed in the p type well. The p type region is used for surrounding the n type region which becomes a vertical CCD register part. Generally, such a structure is called a Hi-C structure. A P⁺ type region for controlling the potential height when transferring is formed between the photo diode and the vertical CCD register part. A P⁺ type region is formed for electrical separation. A P⁺⁺ type region is formed on the surface of a silicon substrate of the photo diode. On the silicon substrate, a gate oxide film is grown. A silicon nitride film is grown in a specified region on the gate oxide film. On the silicon nitride film, a polysilicon electrode which is a conductive electrode, acting as a driving electrode, is formed. On the surface of the polysilicon electrode, a polysilicon oxide film is grown by thermal oxidation. A silicon nitride film as a nitride insulation film is formed on the surface of the polysilicon oxide film. A top oxide film formed by thermally oxidizing the silicon nitride film is formed on the surface of the silicon nitride film. A refractory metal light-shield film is formed on the surface of the top oxide film. When a Poole-Frenkel current flows through a trap in the silicon nitride film, the oxide films formed above and beneath the silicon nitride film function as a barrier to prevent leakage current from flowing.

4 Claims, 5 Drawing Sheets

SOLID-STATE IMAGE PICKUP DEVICE AND METHOD OF MANUFACTURING THE SAME

This application is a continuation of application Ser. No. 07/847,925 filed Mar. 6, 1992 now abandoned.

BACKGROUND OF THE INVENTION

1. Field of the Invention

The present invention relates to a solid-state image pickup device used in video cameras or the like, and a method of manufacturing the same.

2. Description of the Prior Art

Solid-state image pickup devices are employed in video cameras and the like and have recently come to be used widely. As a solid-state image pickup device becomes higher in performance and in picture quality, the characteristics of the solid-state image pickup device become more demanding. In particular, when an intense light enters the solid-state image pickup device, white stripes appear on the monitor, which cause smear. This smear occurs when the light enters the vertical shift register area. It is therefore attempted to decrease the smear by disposing an aluminum light-shield film above the vertical shift register area.

A conventional solid-state image pickup device is described below while referring to the drawing.

FIG. 7 is a unit cell cross-section of a solid-state image pickup device in the prior art extending from the photo-electric converting part (hereinafter called photo diode) and vertical shift register part (vertical Charge Coupled Device (CCD) register part).

First, the p type well 2 is formed on the n⁻ type silicon substrate 1. The n⁻ type region 3 is a photo diode formed on the p type well 2. Also the p type region 4 is formed on the p type well 2. The p type region 4 prevents the electric charge which is generated in the n⁻ silicon substrate 1 from diffusing into the vertical CCD register part, so generation of noise is prevented in the vertical CCD part. The vertical CCD register part is formed in the n type region 5. The p+ type region 6 is formed between the photo diode and the vertical CCD register part. When transferring the signal charge generated in the photo diode to the vertical CCD register part, the P+ type region 6 controls the potential distribution in the n⁻ silicon substrate 1. In the solid-state image pickup device, the photo diode and vertical CCD register part make up a unit cell and unit cells are formed in a matrix. To electrically separate adjacent unit cells, the P+ type region 7 is formed. The P+ type region 7 is formed by ion implantation. To reduce the dark current the P++ type region 8 is formed on the surface of the photo diode. Thus, a buried type photo diode is formed.

Consequently, the gate oxide film 9 and silicon nitride film 10 are grown on the n⁻ silicon substrate 1. A polysilicon film is deposited on the silicon nitride film 10. By etching this polysilicon film, the polysilicon electrode 11 is formed as a driving electrode.

By thermally oxidizing the polysilicon electrode 11, the polysilicon oxide film 12 is formed. Afterwards, the oxide film 13 is grown on the polysilicon oxide film 12. For the prevention of smear noise, the refractory metal light-shield film 14 is formed. By flattening, thereafter, the interlayer dielectric film 15, aluminum light-shield film 16 and protective film 17 are formed sequentially.

In the prior art, it is proposed in the Japanese Laid-open Patent Publication No. 1-253268 to form a refractory metal or a film containing a refractory metal in the region excluding the photo diode as the light-shield film, to form a reflow film on the refractory metal and heat it, and to connect wiring on the reflow film.

In this conventional method, when the refractory metal light-shield film 14 is disposed near the polysilicon electrode 11, the light shielding performance of the refractory metal light-shield film 14 is enhanced relative to light directly entering the polysilicon electrode 11 or light entering through the interlayer dielectric film 15 (beneath the aluminum light-shield film 16). Hence the smear noise is reduced.

The polysilicon oxide film 12 formed by oxidizing the polysilicon electrode 11 is reduced in its film thickness beneath the bottom edge of the polysilicon electrode 11. The thermal oxide film formed by thermally oxidizing the polysilicon is poor in insulation tolerance. The dielectric breakdown voltage of the thermal oxide film formed by thermally oxidizing the polysilicon is about $\frac{1}{2}$ to $\frac{1}{3}$ of that of the thermal oxide film formed on a single-crystalline silicon. To increase the dielectric breakdown voltage in the region beneath the bottom edge of the polysilicon electrode 11, it is required to sufficiently increase the film thickness of the polysilicon oxide film 12 or oxide film 13 formed by CVD.

However, when the interlayer dielectric film composed of the polysilicon oxide film 12 and oxide film 13 is increased in film thickness, smear is likely to occur. This is because the light reflected on the surface of the n⁻ silicon substrate 1 on which the photo diode is formed enters the polysilicon electrode 11 through the interlayer dielectric film composed of polysilicon oxide film 12 and oxide film 13. As a result, the light-shielding effect of the light-shield film decreases, and the smear increases.

If the interlayer dielectric film is made thin to improve the smear, the dielectric breakdown voltage between the refractory metal light-shield film 14 and polysilicon electrode 11 drops. Due to the drop in dielectric breakdown voltage, the image pickup action may be disabled.

That is, the smear of the solid-state image pickup device is determined by the film thicknesses of the polysilicon oxide film 12 and oxide film 13 which are enough to maintain a sufficient dielectric breakdown voltage between the polysilicon electrode 11 and refractory metal light-shield film 14. Thus, in the prior art, it is difficult to decrease the smear sufficiently.

In addition, when the refractory metal light-shield film 14 is formed near the photo diode, the refractory metal atoms in the refractory metal light-shield film 14 diffuse into the oxide film and reach the silicon substrate, 1. In the photo diode, the diffused refractory metal atom may induce crystal defects. In the solid-state image pickup device, such crystal defects cause an image defect called white blemish on the solid-state image pickup device. The white blemish is a serious problem because it lowers the reliability of the solid-state image pickup device.

It is an object of the invention to solve such problems of the prior art by presenting a solid-state image pickup device free from smear, possessing a sufficiently high dielectric breakdown voltage, and capable of suppressing the occurrence of white blemish.

SUMMARY OF THE INVENTION

To achieve the above object, the invention relates to a solid-state image pickup device which has at least one photo diode and a vertical CCD register part formed on a semiconductor substrate, and comprises a conductive electrode which is a driving electrode of the vertical CCD register part, at least one nitride insulation film formed so as to cover this conductive electrode, and a refractory metal light-shield film formed on the nitride insulation film.

To achieve the above object, the invention also relates to a solid-state image pickup device which has at least one photo diode and a vertical CCD register part formed on a semiconductor substrate, has a Hi-C structure formed so as to surround the vertical CCD register part, and comprises a conductive electrode which is a driving electrode of the vertical CCD register part, at least one nitride insulation film formed so as to cover the conductive electrode, and a refractory metal light-shield film formed on the nitride insulation film.

Moreover, to achieve the above object, the invention relates to a method of manufacturing a solid-state image pickup device which has at least one photo diode and a vertical CCD register part formed on a semiconductor substrate, and comprises a conductive electrode which is a driving electrode of the vertical CCD register part, at least one nitride insulation film formed so as to cover the conductive electrode, a refractory metal light-shield film formed on the nitride insulation film, and a conductive light-shield film formed on the refractory metal light-shield film through an interlayer dielectric film.

In this constitution, if an electric charge greater than the charge amount that can be accumulated in the photo diode is generated, it can be discharged from the photo diode into another region.

By setting the impurity concentration of the p type well to a specific value, the photo diode may be easily depleted.

It is also effective to prevent the electric charge, which may become noise (out of the signal generated in the silicon substrate 1), from diffusing into the vertical CCD register part.

In the solid-state image pickup device, the vertical CCD register part may be in a Hi-C structure surrounded by the p type region.

By defining the P+ type region of specified depth and surface concentration, if the voltage driving the solid-state image pickup device is zero volts or 15 volts, counterflow of the electric charge from the vertical CCD register part to the photo diode is prevented, but the electric charge is permitted to flow from the photo diode into the CCD register part.

By specifying the width of the P+ type region, the gm characteristic of the transistor is prevented from worsening, and the output of the photo diode by the short channel effect may be prevented from decreasing.

Also by defining the surface concentration of the P+ type region to be a specific value, the accumulated signal charge is prevented from flowing into an adjacent photo diode, thereby preventing narrow channel effects in the adjacent n type region.

By specifying the P++ type region to have definite depth and surface concentration, dark current can be decreased.

The silicon nitride film suppresses formation of gate bird's beak at the bottom edge of the polysilicon gate electrode when forming the polysilicon gate electrode.

In the solid-state image pickup device using at least one silicon nitride film in the gate insulation film, the electric charge obtained in the photo diode may be easily transferred in the vertical CCD register part.

By using the polysilicon oxide film, the dielectric breakdown voltage of the interlayer dielectric film may be maintained. It is also possible to prevent leakage due to residue of the polysilicon film caused by etching when forming the polysilicon electrode.

Using the top oxide film, the Poole-Frenkel current can be decreased, and the dielectric breakdown voltage is further increased.

By using stacked films of polysilicon oxide, silicon nitride and a top oxide film, the ratio of dielectric breakdown voltage to film thickness may be increased 1.6 times.

By setting the refractory metal light-shield film at a specific value, a sufficient light shielding effect is obtained in the solid-state image pickup device.

Since the aluminum light-shield film and refractory metal light-shield film are used as the light-shield film, the photo-sensitivity may be increased, and a photo diode with high output is obtained.

Beneath the refractory metal light-shield film, there are polysilicon oxide film, silicon nitride film and top oxide film, and pinholes or other defects in the insulation film are almost completely eliminated, and failures which induce dielectric breakdown at low voltage are eliminated, and a high dielectric breakdown voltage is guaranteed. That is, the dielectric breakdown due to operation of the solid-state image pickup device does not occur, and high reliability is obtained.

In addition, since the silicon nitride film is grown by the low pressure method, the silicon nitride film is also grown on an area including the thinner region of the polysilicon oxide film near the bottom edge of the polysilicon electrode, and occurrence of defects in the thinner thickness region, called weak spots, may be prevented by the thin silicon nitride film.

In the lower layer of the refractory metal light-shield film, there is a silicon nitride film, and hence the refractory metal light-shield film is prevented from diffusing into the silicon substrate including photo diode. Accordingly, generation of crystal defects are suppressed, thereby realizing a solid-state image pickup device free from white blemish.

DESCRIPTION OF THE PREFERRED EMBODIMENTS

Figure 1:
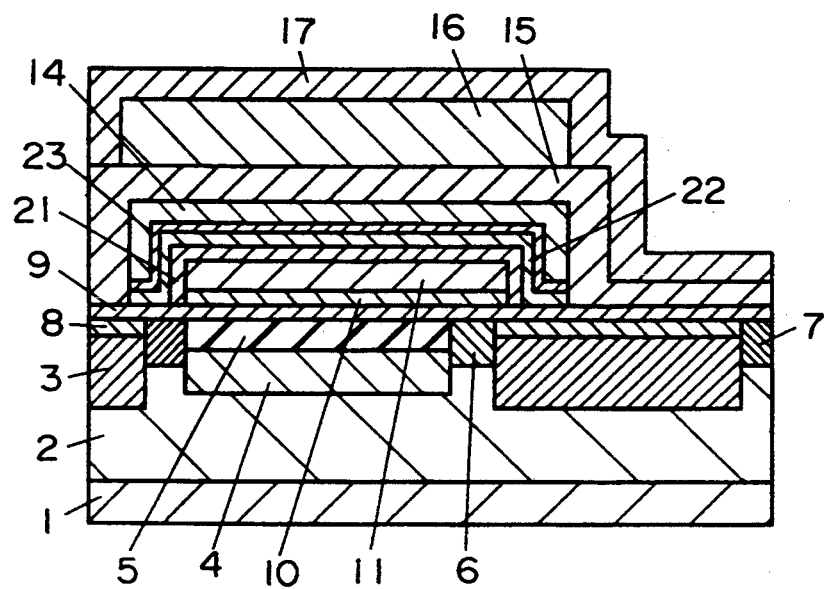
FIG. 1 is a cross section of a solid-state image pickup device in a first embodiment of the invention.

Referring now to the drawings, an embodiment of the invention is described in detail below.

FIG. 1 is a cross section of a solid-state image pickup device in the first embodiment of the invention. In FIG.

Figure 7:
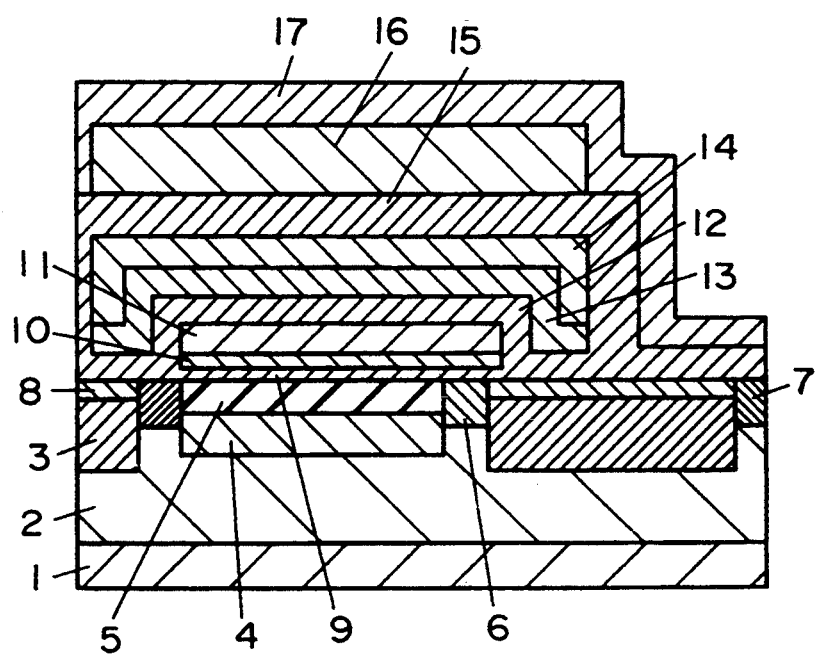
FIG. 7 is a cross section of a conventional solid-state image pickup device.

1, the parts that are the same as in the prior art in FIG. 7 are identified with the same reference numbers.

A p type well 2 is formed on a silicon substrate 1.

The silicon substrate 1 is an n type substrate with a plane azimuth (100). The impurity concentration of the silicon substrate 1 is about $10^{14}$ cm$^{-3}$.

The depth of the p type well 2 is about 5 μm. The impurity concentration of the p type well 2 is about $10^{15}$ cm$^{-3}$. The p type well 2 is provided to discharge the undesired electric charge of the photo diode. That is, in the photo diode formed on the silicon substrate 1, an electric charge is formed by the light entering from outside, and is temporarily accumulated inside. If this electric charge exceeds the capacity of the photo diode, it flows out from the photo diode to run into other regions. If the electric charge flows into the vertical CCD register part, it may induce blooming. Occurrence of such blooming may be prevented by forming the p type well 2. The p type well 2 is fixed at zero volts. The photoelectric converting part is constructed of the photo diode, the p type well 2 and silicon substrate 1. Accordingly, the potential distribution in these regions is arranged so that the electric charge generated in the photo diode may be easily discharged into the silicon substrate 1 through the p type well 2.

By setting the impurity concentration of the p type well 2 to the value specified above, the photo diode may be easily depleted when the solid-state image pickup device is put in action. When the photo diode is easily depleted, the capacity of the signal converted by the photo diode can be increased.

The depth of the p type well 2 is limited by the depth of the photo diode and the dielectric breakdown voltage between the two. The depth of the photo diode is required to be about 2 μm in order to obtain a sufficient photo-electric conversion efficiency when the visible rays enter.

In the p type well 2 an n$^-$ type region 3 is formed as a photo diode.

When the light enters the n$^-$ type region 3 from outside, electron and hole pairs are formed inside the n$^-$ type region 3. The electrons become signal charges through the adjacent vertical CCD register part. The holes are taken out of the silicon substrate 1 through the p type well 2. Thus, the photo diode is the area converting the incident light into an electric signal charge.

Also, in the p type well 2, a p type region 4 is formed. The p type region 4 prevents the electric charge which causes noise (from the signal generated in the silicon substrate 1) from diffusing into the vertical CCD register part.

The depth of the p type region 4 is about 1 μm. The impurity concentration of the p type region 4 is about $10^{16}$ cm$^{-3}$.

The p type region 4 is formed for surrounding the n type region 5 which becomes a vertical CCD register part. Generally such a structure is called a Hi-C structure.

If the depth of the p type region 4 is increased, diffusion in the lateral direction is promoted at the same time. Accordingly, the p type region 4 extends up to the n$^-$ type region 3 of the photo diode.

When the p type region 4 extends into the photo diode, the output of the photo diode is lowered.

As long as the impurity concentration of the p type region 4 is higher than that of the p type well 2, the Hi-C structure is realized.

The vertical CCD register part is formed of the n type region 5. The vertical CCD register part is the transfer region for transferring the signal charge formed by the photo diode into a specified region.

The depth of the n type region 5 is about 0.5 μm. The impurity concentration of the n type region 5 is $10^{16}$ to $10^{17}$ cm$^{-3}$.

The impurity concentration of the n type region 5 transfers the signal charge formed by the photo diode. The area of the n type region 5 is smaller than the area of the photo diode. Accordingly, to transfer the signal charge of the photo diode, the impurity concentration of the n type region 5 must be increased. This is because, to increase the area by further deepening the n type region 5, the driving voltage of the solid-state image pickup device must be varied, and the transfer efficiency of the vertical CCD part register becomes worse.

In the diagram, the positions of the ends of the p type region 4 and those of the ends of the n type region 5 are matched, but in order to realize the Hi-C structure, the p type region 4 must be broader.

When transferring the signal charge generated from the photo diode to the vertical CCD register part, the potential height in the vertical CCD register part is set lower than that in the photo diode. It is also necessary to prevent counterflow of the signal charge brought into the vertical CCD register part into the photo diode, or flow of the signal charge in the photo diode into the vertical CCD register part while there is already a signal charge in the vertical CCD register part. Accordingly, the P$^+$ type region 6 for controlling the potential height when transferring is formed between the photo diode and the vertical CCD register part. When the signal charge is transferred from the photo diode into the vertical COD register part, it is controlled so that the potential height in the P$^+$ type region 6 may be lower than that in the photo diode, and be equal to or slightly higher than that in the vertical CCD register part. When signal charges are transferred in the vertical CCD register parts, in order that the signal charges may not flow back into the photo diode, it is controlled so that the potential height in the P$^+$ type region 6 may be higher than that in the photo diode, and be higher than that in the vertical CCD register part.

The depth of the P$^+$ type region 6 is about 1 μm. The surface concentration of the P$^+$ type region 6 in the silicon substrate 1 is 1016 to 1017 cm$^{-3}$.

When the voltage for driving the solid-state image pickup device is −10 volts, zero volts or 15 volts, it is necessary to prevent counterflow of the signal charge from the vertical CCD register part into the photo diode, or to allow the signal charge to flow from the photo diode into the vertical CCD register part. Therefore, the depth and impurity concentration of the p$^+$ type region 6 are determined so as to achieve the threshold voltage, to present the optimum potential distribution in each state.

The width of the P$^+$ type region 6 should be about 1 μm or less. If the width of the P$^+$ type region 6 is larger than 1 μm, the gm characteristic of the transistor is impaired. If the gm characteristic deteriorates, the signal charged collected in the photo diode may not be transferred into the vertical CCD register part completely. To the contrary, if the width of the P$^+$ type region 6 is smaller than 1 μm, the short channel effect takes place. Due to the short channel effect, punch-through is likely to occur, and the dynamic range of the photo diode finally becomes smaller.

In the solid-state image pickup device, the photo diodes and vertical CCD register parts form pairs, which are formed in a matrix. In order to electrically isolate the adjacent pairs, the P+ type region 7 is formed. This P+ type region 7 is formed by ion implantation.

The depth of the P+ type region 7 is about 1 μm. The surface concentration of the P+ type region 8 is $10^{17}$ to $10^{16}$ cm$^{-3}$.

The surface concentration of the P+ type region 7 must be set in the above range so that the accumulated signal charge does not flow into the adjacent photo diode. If the surface concentration is larger than $10^{18}$ cm$^{-3}$, the narrow channel effect takes place in the n type region 5. When the narrow channel effect occurs, the capacity of the transfer region in the vertical CCD register part decreases. As a result, the dynamic range of the solid-state image pickup device becomes small, and the transfer efficiency drops.

The width of the P+ type region 7 should be about 1 μm or less. If the width of the P+ type region 7 is larger than 1 μm, the transfer region is contracted. That is, the signal charges generated in the photo diode may not be completely transferred into the vertical CCD register part. On the other hand, if the width of the p+ type region 7 is smaller than 1 μm, the short channel effect takes place. By this short channel effect, punch-through is likely to occur between the adjacent photo diode and the vertical CCD register part. As a result, the resolution is lowered because of transferring the signal charge in the adjacent photo diode into the vertical CCD register part. In addition, the dynamic range of the photo diode is lowered.

Furthermore, a P++ type region 8 is formed on the surface of the photo diode on the silicon substrate 1.

By forming the P++ type region 8, the dark current may be reduced.

The depth of the P++ type region 8 is set at about 0.5 μm or less. The surface concentration of the P++ type region 8 is $10^{18}$ to $10^{19}$ cm$^{-3}$. Generally, the dark current forms in the interface between the silicon substrate 1 and the gate oxide film 9 which is mentioned below. The dark current value is usually between ten and hundreds of electrons. Occurrence of dark current is a fatal defect for the solid-state image pickup device. That is, if a dark current forms in the absence of light (dark state), background noise non-uniformity occurs on the monitor produced by the solid-state image pickup device. By such background noise non-uniformity, the S/N ratio of the video signal is determined. By the dark current, the minimum luminous intensity is determined for the object image. Besides, increase of dark current causes the dynamic range of the solid-state image pickup device to narrow.

The depth of the P++ type region 8 should be as small as possible. As the depth of the P++ type region 8 increases, the length of the active photo diode becomes shorter in the depthwise direction of the silicon substrate 1.

By defining the impurity concentration of the P++ type region 8 as specified above, the rate of recombination of electrons may be increased. As a result the dark current is reduced.

Thus, the n− type region 3 of the photo diode is buried in the silicon substrate 1, and a buried type photo diode is formed.

A gate oxide film 9 is grown on the silicon substrate 1.

The gate oxide film 9 is formed by the pyrooxidation method. The thickness of the gate oxide film 9 is about 50 nm. To raise the transfer efficiency, it is desirable to keep the thickness of the gate oxide film 9 more than 50 nm.

A silicon nitride film 10 is grown in a specified region on the gate oxide film 9.

The silicon nitride film 10 is formed on the gate oxide film 9 above the region including the photo diode in the silicon substrate 1, the P+ region 6 and the vertical CCD register part.

The silicon nitride film 10 is formed by the CVD method. The thickness of the silicon nitride film 10 is about 50 nm. The silicon nitride film 10 is disposed in order to suppress formation of gate bird's beak at the end bottom edge of the polysilicon gate electrode when forming the polysilicon gate electrode.

The silicon nitride film 10 is formed by the low pressure CVD method. The thickness of the silicon nitride film 10 is about 50 nm. It is used as a gate insulation film immediately beneath the gate electrode. The silicon nitride film 10 is formed by the low pressure CVD method.

The silicon nitride film 10 is formed as partly overlapping with the photo diode in the silicon substrate 1. This is intended to facilitate transferring of the signal charge in the photo diode.

If the silicon nitride film 10 is formed up to the outside of the vertical CCD register part, that is, it reaches up to the separation region, the signal charge is transferred from the photo diode adjacent to the separation region. It is hence necessary to properly control the overlapping extent of the silicon nitride film 10 and the separation region.

When the silicon nitride film 10 is formed inside of the right end of the vertical CCD register part, it is difficult to transfer the signal charge in the photo diode.

On the silicon nitride film 10 there is formed a polysilicon electrode 11 which is a conductive electrode to be used as a driving electrode.

The polysilicon electrode 11 is formed by the low pressure CVD method. The sheet resistance of the phosphorus doped polysilicon electrode 11 is about tens ohms. The film thickness of the polysilicon electrode 11 is about 500 nm. The polysilicon electrode 11 is used as the electrode for applying a high frequency pulse for transferring the signal charge in the photo diode. Thus, since a high frequency pulse is applied to the polysilicon electrode 11, the resistance of the polysilicon electrode 11 is desired to be as low as possible.

On the surface of the polysilicon film 11 a polysilicon oxide film 21 is grown by thermal oxidation.

The polysilicon oxide film 21 is formed by pyrogenic-oxidation method. The thickness of the polysilicon oxide film is about 150 nm. The polysilicon oxide film 21 is formed in order to maintain the specific dielectric breakdown voltage of the interlayer dielectric film. Incidentally, due to residue of the polysilicon film (caused by etching when forming the polysilicon electrode 11), when a driving voltage is applied, leakage current flows through the residue of the polysilicon film. The polysilicon oxide film 21 prevents such leakage.

On the surface of the polysilicon oxide film. 21, a silicon nitride film 22 which is a nitride insulation film is formed.

The silicon nitride film 22 is formed by the low pressure CVD method. The thickness of the silicon nitride film 22 is about 30 nm. The silicon nitride film 22 is used as the interlayer dielectric film.

On the surface of the silicon nitride film 22, top oxide film 23 is formed by thermally oxidizing the silicon nitride film 22.

The top oxide film 23 is formed by pyrogenic-oxidation method. The thickness of the top oxide film 23 is about 5 nm. The top oxide film 23 functions as the barrier for the current flowing inside (Poole-Frenkel current). With the top oxide film 23 as the barrier, the current is hardly trapped in the silicon nitride film 22. Hence, such current may be decreased. Moreover, the dielectric breakdown voltage is increased by forming the top oxide film 23.

In the prior art, if only the polysilicon oxide film is used, at the thickness of the polysilicon oxide film of 150 nm, the breakdown voltage is 50 volts. By contrast, in this embodiment, with a polysilicon oxide film of 150 nm thickness, and the total thickness of silicon nitride film and top oxide film at 30 nm, the breakdown voltage is 80 volts. That is, when the total film thickness is 1.2 times the thickness in the prior art, the breakdown voltage is increased 1.6 times as compared with the prior art.

On the surface of the top oxide film 23 is formed a refractory metal light-shield film 14.

The refractory metal light-shield film 14 is formed by the sputtering or CVD method.

The thickness of the refractory metal light-shield film 14 is about 200 nm or more. As the refractory metal light-shield film 14, for example, when using tungsten silicide, at the film thickness of 200 nm, the light transmittance with the wavelength of 800 nm passing through the refractory metal light-shield film 14 may be controlled under 0.1%. Thus, at the thickness of the refractory metal light-shield film 14 of more than 200 nm, a sufficient light shielding effect is obtained in the solid-state image pickup device. When a sufficient light shielding effect is obtained, the smear noise caused by the light passing through the refractory metal light-shield film 14 may be decreased.

In the exposed region of the refractory metal light-shield film 14 and the gate oxide film 9 on the photo diode, an interlayer dielectric film 15 is formed. As the interlayer dielectric film 15, a boron-phosphosilicate-glass (BPSG) film is used. If it is not necessary to flatten the surface by the interlayer dielectric film 15, a non-doped silicate glass (NSG) film may be used. The interlayer dielectric film 15 is formed by the CVD method. The thickness of the interlayer dielectric film 15 is about 100 nm or more.

On the surface of the interlayer dielectric film 15, an aluminum light-shield film 16 is formed on the top of the rough surface.

By thus using the refractory metal light-shield film 14 and aluminum light-shield film 16 immediately beneath the interlayer dielectric film 15 as the light-shield films, the light-shield effect for the solid-state image pickup device may be further enhanced.

The end portion of the aluminum light-shield film 16 ideally should be nearly equal in width to the end portion of the refractory metal light-shield film 14. That is, if they are nearly equal in width and nearly equal in position, the photo-sensitivity of the photo diode may be improved, and a photo diode with high dynamic range is obtained.

In this embodiment, the aluminum light-shield film 16 is formed by sputtering. The thickness of the aluminum light-shield film 16 is about 1 μm. The aluminum light-shield film 16 is used as the wiring material as well as the light-shield film.

A protective film 17 is formed on the surface of the aluminum light-shield film 16 and in the exposed region of the interlayer dielectric film 15 on the photo diode.

The protective film 17 is formed by the plasma enhanced CVD method. The thickness of the protective film 17 is 100 nm or more.

The protective film 17 must be a film with a high light transmittance. For this purpose, the top oxide film or silicon nitride film are preferable. These films are almost free from pinholes, hardly form cracks, and are high in resistance to ionic contamination.

That is, in the solid-state image pickup device in the first embodiment, when the Poole-Frenkel current flows through the trap in the silicon nitride film, the oxide films formed above and beneath the silicon nitride film function as a barrier to prevent leakage current from flowing.

Figure 2:
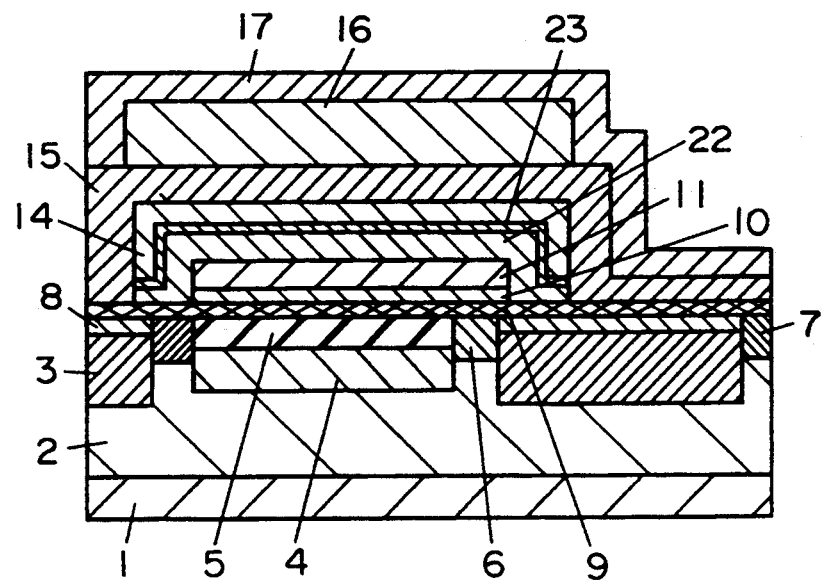
FIG. 2 is a cross section of a solid-state image pickup device in a second embodiment of the invention.

FIG. 2 is a cross section of a solid-state image pickup device in a second embodiment of the invention.

The difference between the second embodiment and the first embodiment is the type of the insulation film formed between the polysilicon electrode and the refractory metal light-shield film.

First, a p type well 2 is formed on a silicon substrate 1. In the p type well 2, an n⁻ type region 3 which becomes a photo diode is formed. Also a p type region 4 is formed in the p type well 2. The p type region 4 is formed to enclose an n type region 5 which becomes a vertical CCD register part. Generally, such a structure is called a Hi-C structure.

The vertical CCD register part is composed of the n type region 5. The vertical CCD register part is the transfer region for transferring the signal charge in the photo diode into a specified region.

In the diagram, both ends of the p type region 4 and both ends of the n type region 5 are matched, but to realize the Hi-C structure it is required that the p type region 4 be broader.

A P+ type region 6 for controlling the potential distribution when transferring is formed between the photo diode and vertical CCD register part.

In the solid-state image pickup device, photo diodes and vertical CCD register parts form pairs, which are formed in a matrix. To electrically separate the adjacent pairs, a P+ type region 7 is formed. In addition, a P++ type region 8 is formed on the surface of the photo diode in the silicon substrate 1. By forming the P++ type region 8, the dark current can be decreased.

A gate oxide film 9 is grown on the silicon substrate 1. A silicon nitride film 10 is grown in a specified region on the gate oxide film 9.

The silicon nitride film 10 is formed on the gate oxide film 9 above the region including the photo diode, P+ region 6 and vertical CCD register part in the silicon substrate 1.

A polysilicon electrode 11 to be used as a driving electrode is formed on the silicon nitride film 10.

A silicon nitride film 22 is formed on the surface of the polysilicon electrode 11.

The silicon nitride film 22 is formed by low pressure CVD. The thickness of the silicon nitride film 22 is about 100 nm. The silicon nitride film 22 is used as an interlayer dielectric film.

On the surface of the silicon nitride film 22, a top oxide film 23 is formed by thermally oxidizing the silicon nitride film 22.

The top oxide film 23 is formed by pyrogenic-oxidation. The thickness of the top oxide film 23 is about 5 nm. The top oxide film 23 functions as a barrier to the electrons flowing inside (Poole-Frenkel current). The electrons in the top oxide film 23 are captured by the trap in the top oxide film 23. Therefore, such current (Poole-Frenkel current) can be decreased. Furthermore, by forming the top oxide film 23, the dielectric breakdown voltage is increased.

A refractory metal light-shield film 14 is formed on the surface of the top oxide film 23.

An interlayer dielectric film 15 is formed on the refractory metal light-shield film 14 and the exposed region of the gate oxide film 9 on the photo diode. On the surface of the interlayer dielectric film 15, an aluminum light-shield film 16 is formed on the top of the rough surface. A protective film 17 is formed on the surface of the aluminum light-shield film 16 and in the exposed region of the interlayer dielectric film 15 on the photo diode.

Thus, in the second embodiment, polysilicon oxide film 21 obtained by thermal oxidation is not grown on the surface of the polysilicon electrode 11.

The purpose of forming the polysilicon oxide film 21 is, as mentioned above, to guarantee the dielectric breakdown voltage of the interlayer dielectric film, and to prevent leakage current through etching residue of the polysilicon film.

In the second embodiment, therefore, although the polysilicon oxide film 21 is not provided, the dielectric breakdown voltage of the interlayer dielectric film 15 is guaranteed by increasing the thickness of the silicon nitride film 22. As for the leakage due to etching residue (which is another purpose of the first embodiment), it cannot be prevented in the second embodiment. However, the etching residue may be sufficiently avoided by overetching at the time of forming the polysilicon electrode 11. Thus, in the second embodiment, the same effects as in the first embodiment are obtained except for the effect of preventing etching residue.

Figure 3:
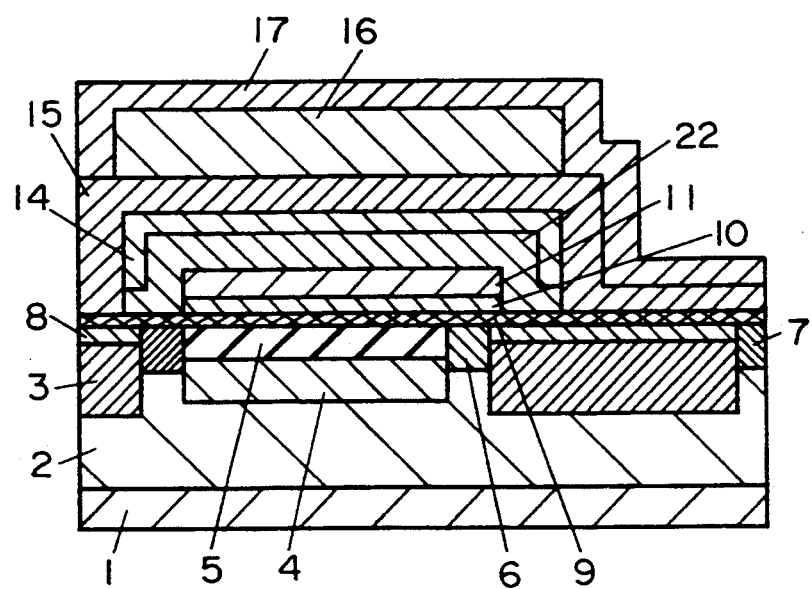
FIG. 3 is a cross section of a solid-state image pickup device in a third embodiment of the invention.

FIG. 3 is a cross section of a solid-state image pickup device in a third embodiment of the invention.

The difference between the third embodiment and the second embodiment lies in the type of the insulation film formed between the polysilicon electrode and the refractory metal light-shield film.

First, a p type well 2 is formed on a silicon substrate 1. In the p type well 2, an $n^-$ type region 3, which becomes a photo diode, is formed. Also in the p type well 2, a p type region 4 is formed. This p type region 4 is formed for enclosing an n type region 5 which becomes a vertical CCD register part. Generally such a structure is called an Hi-C structure.

The vertical CCD register part is composed of the n type region 5. The vertical CCD register part is the transfer region for transferring the signal charge in the photo diode into a specified region.

In the diagram, both ends of the p type region 4 and both ends of the n type region 5 are matched, but in order to realize the Hi-C structure, a more broadly formed p type region 4 is desirable.

A $P^+$ type region 6 for controlling the potential distribution at the time of transferring is formed between the photo diode and the vertical CCD register part.

In the solid-state image pickup device, photo diodes and vertical CCD register parts are formed in pairs, which are formed in a matrix. To separate the adjacent pairs electrically, a $P^+$ type region 7 is formed. In addition, $P^{++}$ type region 8 is formed in the surface of the photo diode in the $n^-$ type silicon substrate 1. By forming the $P^{++}$ type region 8, dark current can be decreased.

On the silicon substrate 1, a gate oxide film 9 is formed. A silicon nitride film 10 is grown in a specified region on the gate oxide film 9.

The silicon nitride film 10 is formed on the gate oxide film 9 above the region including the photo diode, $P^+$ region 6 and vertical CCD register part in the silicon substrate 1.

On the silicon nitride film 10, a conductive electrode 11 (such as polysilicon) is formed as driving a electrode.

On the surface of the polysilicon electrode 11, a silicon nitride film 22 is formed.

The silicon nitride film 22 is formed by low pressure CVD. The thickness of the silicon nitride film 22 is about 100 run. The silicon nitride film 22 is formed as an interlayer dielectric film. On the surface of the silicon nitride film 22, a refractory metal light-shield film 14 is formed.

An interlayer dielectric film 15 is formed on the refractory metal light-shield film 14 and in the exposed region of the gate oxide film 9 on the photo diode. On the surface of the interlayer dielectric film 15, a conductive light-shield film 16 (such as aluminum) is formed on the tops of the rough surface. A protective film 17 is formed on the surface of the aluminum light-shield film 16 and in the exposed region of the interlayer dielectric film 15 on the photo diode.

Thus, in the third embodiment, as in the second embodiment, polysilicon oxide film 21 obtained by thermal oxidation is not grown on the surface of the polysilicon electrode 11. Besides, the top oxide film 23 formed by thermal oxidation of silicon nitride film 22 is not formed on the surface of the polysilicon nitride film 22.

The purpose of forming the polysilicon oxide film 21 was explained in relation to the second embodiment. The demerit caused by the absence of the polysilicon oxide film 21 is, as in the second embodiment, the occurrence of leakage current through etching residue of the polysilicon film. But this problem may be solved by extending the etching time at the time of etching.

In addition, unlike the second embodiment, since the top oxide film 23 is not formed on the silicon nitride film 22, the following shortcoming is known. That is, in the presence of top oxide film 23, it functions as the barrier of Poole-Frenkel current, and the dielectric breakdown voltage is increased. This point becomes a demerit in the third embodiment.

The disadvantage relating to the dielectric breakdown voltage may be avoided by forming the silicon nitride film 22 in a sufficient thickness. The function as the barrier to the Poole-Frenkel current is slightly inferior. But it may be used depending on the purpose in consideration of the characteristics of the solid-state image pickup device.

In the third embodiment, except for the above shortcomings, the same effects as in the first embodiment are obtained.

Thus, according to the first embodiment in which the polysilicon oxide film, silicon nitride film and top oxide film are present beneath the refractory metal light-shield film, the second embodiment in which the silicon nitride film and top oxide film are present beneath the refractory metal light-shield film, and the third embodiment in which silicon nitride film is present beneath the refractory metal light-shield film, pinholes, weak spots and other defects in the insulation film are completely eliminated. Weak spots refer to positions where thin polysilicon oxide films are formed at the lower ends of the polysilicon electrode by thermally oxidizing the polysilicon electrode. In these embodiments, since a uniform thickness silicon nitride film is at least formed in the weak spots, the substantial film thickness is enough. Hence, failures caused by pinholes and weak spots are eliminated. In particular, it is effective against dielectric breakdown which may occur when a low voltage is applied.

This is more specifically explained below by reference to the drawings.

Figure 4:
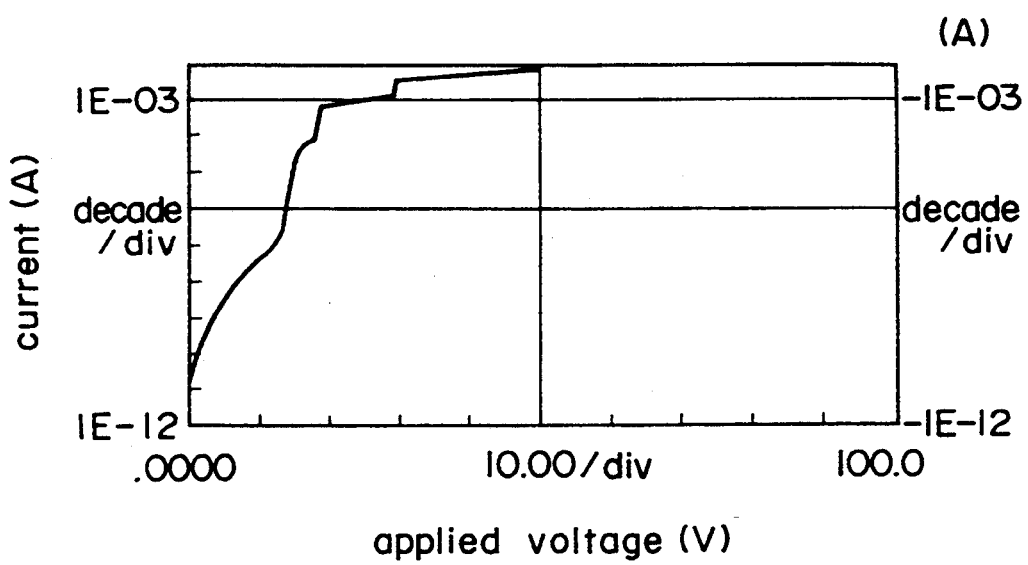
FIG. 4 is an I-V characteristic diagram of a conventional solid-state image pickup device.

FIG. 4 shows an I–V characteristic of a conventional solid-state image pickup device. In this example, a polysilicon oxide film and TEOS oxide film are formed on a polysilicon electrode. The thickness of the polysilicon oxide film is 150 nm, and the thickness of the TEOS oxide film is 30 nm.

The abscissas denotes the applied voltage (V), and the ordinate represents the current (I). In this case, when the current is $10^{-7}$ amperes, the applied voltage is about 12 volts. It is also known that a complete dielectric breakdown took place at the applied voltage of about 19 volts.

Figure 5:
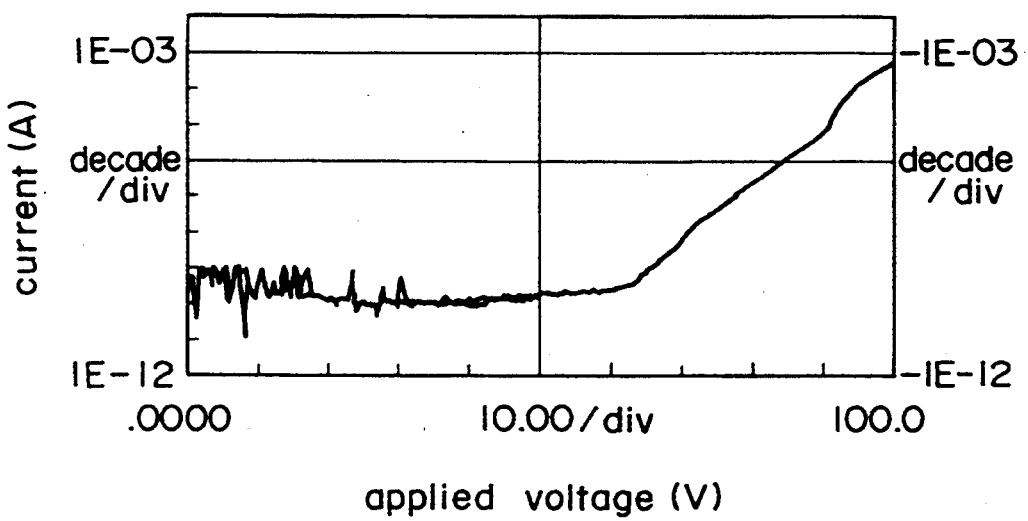
FIG. 5 is an I-V characteristic diagram of a solid-state image pickup device according to an exemplary embodiment of the invention.

FIG. 5 shows an I–V characteristic of the solid-state image pickup device in the second embodiment of the invention. In this example, the polysilicon oxide film and silicon nitride film are formed on the polysilicon electrode. The thickness of the polysilicon oxide film is 150 nm, and the thickness of silicon nitride is 40 nm.

The abscissas is the applied voltage (V) and the ordinate denotes the current (I). In this case, when the current is $10^{-7}$ amperes, the applied voltage is about 78 volts. Thus, as compared with the conventional solid-state image pickup device, the applied voltage leading to dielectric breakdoom may be increased about 6 times.

In this embodiment, therefore, a sufficient dielectric breakdown voltage is guaranteed, and the solid-state image pickup device has high reliability.

A method of manufacturing a solid-state image pickup device is explained below by referring to the accompanying drawings.

FIG. 6 a–d show a cross section in a sequence of steps for explaining the method for manufacturing a solid-state image pickup device in accordance with the invention.

First, a thermal oxide film of about 100 nm is formed on the principal plane of an n− type silicon substrate 1. Through the thermal oxide film, boron ions are implanted on the entire surface of the silicon substrate 1. Afterwards, by heat treatment, a p type well 2 is formed.

This heat treatment is conducted for several hours at a heat treatment temperature of 1000° C. or more in a nitrogen atmosphere.

By this heat treatment, the implanted boron ions are activated.

Next, a photoresist is deposited on the silicon substrate 1. The n− region 3 for forming the photo diode is exposed and developed to form a resist pattern. Using this resist pattern as the mask, phosphorus ions are implanted.

At this time, the ion implanting condition is the power of hundreds of keV, and an implantation dose of about $10^{12}$ cm$^{-2}$. Afterwards, heat treatment is conducted in a nitrogen atmosphere. As a result, the impurity depth of the n− type region 3 is about 2 μm.

In this way, the n− type region 3 of photo diode is formed in the specified region in the p type well 2.

Using this resist pattern as a mask, boron ions are implanted.

At this time, the ion implantation condition is the power of scores of keV, and implantation dose of about $10^{13}$ to $10^{14}$ cm$^{-2}$. As a result, the impurity depth of the P++ type region 8 is about 0.5 μm.

Thus the P++ type region 8 for reducing the dark current is formed on the surface of photo diodes in the n− type silicon substrate 1.

Consequently, the photoresist on the silicon substrate 1 is removed, and the photoresist is deposited again on the silicon substrate 1. By exposing and developing the p type region 4, the resist pattern is formed. Using this resist pattern as the mask, boron ions are implanted.

At this time, the ion implantation condition is the power of about 100 keV, and implantation dose of $10^{12}$ cm$^{-2}$. Hence, the impurity depth of the p type region 4 is about 1 μm.

To form the n type region 5 in the Hi-C structure as mentioned above, the depth of the p type region 4 must be controlled around 1 μm.

In this way, for preventing the signal charge generated in the silicon substrate 1 from causing noise (from diffusing into the vertical CCD register part), the p type region 4 is formed in the p type well 2.

Using this resist pattern as the mask, phosphorus ions are implanted.

At this time, the ion implanting condition is the power of about 100 keV and implantation dose of $10^{12}$ cm$^{-2}$. Thus, the impurity depth of the n type region 5 is about 0.5 μm.

Thus, the n type region 5 is formed as the vertical CCD register part.

Next, removing the photoresist on the silicon substrate 1, the photoresist is deposited again on the silicon substrate 1. By exposing and developing the p+ type region 6, the resist pattern is formed. Using this resist pattern as the mask, boron ions are implanted.

The ion implantation condition at this time is the power of hundreds of keV and implantation dose of $10^{12}$ cm$^{-2}$. Hence, the impurity depth of the P+ type region 6 is about 1 μm. By implanting under such conditions, the threshold voltage between the photo diode and vertical CCD register may be controlled.

In this way, when transferring the signal charge generated in the photo diode from the photo diode into the vertical CCD register part, the P+ region 6, for controlling the potential distribution for transferring, is formed between the photo diode and the vertical CCD register part.

By removing the photoresist on the silicon substrate 1, the photoresist is deposited again on the silicon substrate 1. By exposing and developing the p+ type region 7, a resist pattern is formed. Using this resist pattern as the mask, boron ions are implanted.

The ion implantation condition at this time is the power of scores of keV and implantation dose of about $10^{13}$ cm$^{-2}$. As a result, the impurity depth of the p+ type region 7 is about 1 μm.

The P+ type region 7 is separated from the adjacent pixel, and the threshold voltage is raised so as not to conduct with the voltage applied at the time of operation. For this purpose, the impurity concentration of the P+ type region 7 is relatively high. In particular, the concentration should be higher than the impurity concentration of the P+ type region 6.

Thus, in the solid-state image pickup device, the photo diode and vertical CCD register part are formed in a pair, and the pairs are formed in a matrix. To separate the adjacent pairs electrically, the P+ type region 7 is formed.

Figure 6A:
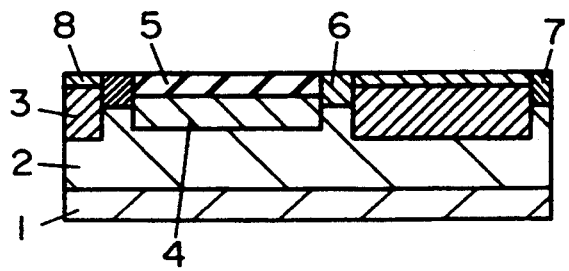
FIG. 6 is a cross section of the processes showing a method of manufacturing the same solid-state image pickup device.

Up to this step, a buried type photo diode having the surface layer covered with the p type region is formed (FIG. 6A).

In succession, the gate oxide film 9 is formed on the silicon substrate 1.

The gate oxide film 9 is formed by the low pressure CVD method. The thickness of the gate oxide film 9 is about 50 nm.

A silicon nitride film 10 is grown on the gate oxide film 9. The gate nitride film 10 is formed by the low pressure CVD method. The thickness of the gate nitride film 10 is about 50 nm.

The silicon nitride film 10 suppresses the gate bird's beak which may be formed at the bottom end portion of the gate electrode when forming the gate electrode in a later step and oxidizing the gate electrode.

Next, a polysilicon film is deposited on the silicon nitride film 10.

The polysilicon film is formed by the low pressure CVD method. The thickness of the polysilicon film is about 500 nm. At this time, the sheet resistance is of the order of scores of ohms.

The silicon nitride film 10 immediately beneath the polysilicon film is to prevent formation of a gate bird's beak. If a gate bird's beak is formed, the bottom end portion of the polysilicon electrode is built up. When a voltage is applied to the polysilicon electrode, a potential dip is formed in the silicon substrate 1. The potential distribution is desirably made uniform in the silicon substrate 1. However, once a gate bird's beak is formed, the potential formed in the bottom end portion becomes lower. A dip of potential distribution is formed at this position of the gate bird's beak. The dip causes leftover electrons. As a result it is difficult to transfer the signal charge efficiently in the solid-state image pickup device.

Afterwards, a photoresist is deposited on the polysilicon film. By exposing and developing areas other than the n type transfer region 5, P+ type region 6, and the region including a part of the n− photo diode region 3, a resist pattern is formed. Using this resist pattern as the mask, dry etching is performed. By dry etching, the polysilicon film of the upper layer and the silicon nitride film 10 of the lower layer are etched to the same width.

Thus is formed the polysilicon electrode 11 as the driving electrode.

For dry etching, a mixed gas of sulfur hexafluoride and hydrogen bromide is used.

By etching using this gas, the precision of the etching pattern dimensions is improved. In addition, stable etching is realized because the selective ratio of the photoresist and polysilicon film, and photoresist and silicon nitride film are respectively high. Furthermore, the etching rate with respect to the top oxide film formed on the boundary surface of the polysilicon film and silicon nitride film may be easily controlled, and a pattern with a specified shape may be obtained.

Figure 6B:
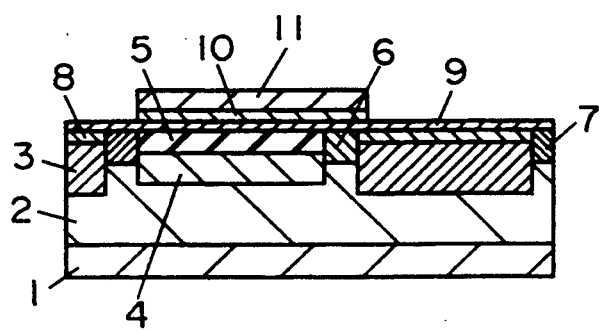

The polysilicon electrode 11 is then thermally oxidized, and a polysilicon oxide film 21 is grown as shown in (FIG. 6B).

The polysilicon oxide film 21 is formed by pyro-oxidation. The thickness of the polysilicon oxide film 21 is about 150 nm.

In the prior art, the dielectric breakdown voltage between the refractory metal light-shield film 14 and polysilicon electrode 11 is low. Usually, when the thickness of the oxide film in the region enclosed between the refractory metal light-shield film 14 and polysilicon electrode 11 is 150 nm, the dielectric breakdown voltage is 50 volts; but when the thickness is 200 nm, it is 65 volts. It is accordingly necessary to form the polysilicon oxide film 21 in a thickness of over 200 nm.

In this embodiment, the polysilicon oxide film 21 is not used between the refractory metal light-shield film 14 and polysilicon electrode 11, but the following stacked film is formed.

A silicon nitride film 22 is grown on the polysilicon oxide film 21 by low pressure CVD. The thickness of the silicon nitride film 22 is about 30 nm.

The silicon nitride film 22 formed by the low pressure CVD is high in uniformity of film thickness, and its step coverage is excellent for the step difference of the ground surface.

By using the silicon nitride film 22, a sufficiently high dielectric breakdown voltage is obtained, and the total film thickness may be 150 nm or less. As long as the total film thickness is within 150 nm, the dielectric breakdown voltage may be 65 volts. If the total film thickness is greater than 150 nm, the dielectric breakdown voltage increases, but the light entering this stacked film increases by avoiding the refractory metal light-shield film 14. This light enters the vertical CCD register part. Hence, the light leak-in increases.

Afterwards, by thermally oxidizing the surface of the silicon nitride film 22, a top oxide film 23 is formed in the silicon nitride film 22 in a thickness of about 5 nm.

The top oxide film 23 is formed by the pyrogenic-oxidation.

The thickness of the top oxide film 23 is only 5 nm because it takes a long time in heat treatment to form a thick film and the impurity profile in the diffusion region varies.

Then the refractory metal light-shield film 14 is grown to a desired film thickness.

The refractory metal light-shield film 14 is formed by low pressure CVD or sputtering.

Figure 6C:
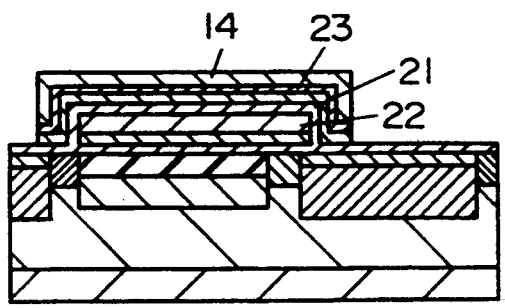

The thickness of the refractory metal light-shield film 14 is about 200 nm. For the refractory metal light-shield film 14, a tungsten silicide film is used. If the thickness of tungsten silicide film is about 200 nm, the light transmittance passing through the film is less than 0.1%. Thus, a favorable light-shield plate is obtained as shown in (FIG. 6C).

Consequently, a photoresist is deposited on the refractory metal light-shield film 14. By exposing and developing the areas other than the region covering the vertical CCD register part, a resist pattern is formed. Using this resist pattern as the mask, dry etching is performed. By one dry etching step, the refractory metal light-shield film 14, the top oxide film 23, and silicon nitride film 22 are patterned simultaneously.

That is, in the lower part of the refractory metal light-shield film 14, all of top oxide film 23 and silicon nitride film 22 are present, and the number of process steps for etching is same as in the prior art.

For dry etching, a mixed gas of sulfur hexafluoride and hydrogen bromide is used.

By using this gas in etching, the precision of the etching pattern dimensions is enhanced. When etching the silicon nitride film, by varying only the gas flow rate, stable etching of high selective ratio may be easily achieved.

Next, an interlayer dielectric film 15 is formed in the refractory metal light-shield film 14 and in the exposed region of the gate oxide film 9 on the photo diode.

The interlayer dielectric film 15 is formed by CVD. The thickness of the interlayer dielectric film is hundreds of nanometers or more. In order to flatten the surface of the substrate by the interlayer dielectric film 15, a BPSG film is used.

On the surface of the interlayer dielectric film 15, an aluminum light-shield film 16 is formed on the tops of the rough surface.

The aluminum light-shield film 16 is formed by sputtering. The thickness of the aluminum light-shield film 16 is about 1 $\mu$m.

The light-shield effect is made perfect by the aluminum light-shield film 16 and the refractory metal light-shield film 14.

Later, the photoresist is deposited on the aluminum light-shield film 16. Exposing and developing the areas other than the region covering the vertical CCD register part, a resist pattern is formed. Using this resist pattern as the mask, dry etching is performed.

For dry etching, a mixed gas of boron trichloride, chlorine and trichloromethane (chloroform) is used.

A protective film 17 is formed on the surface of the aluminum light-shield film 16 and in the exposed region of the interlayer dielectric film 15 on the photo diode.

The protective film 17 is formed by plasma enhanced CVD. By using it, a protective film 17 of excellent step coverage and having a high transmittance of light is formed.

Figure 6D:
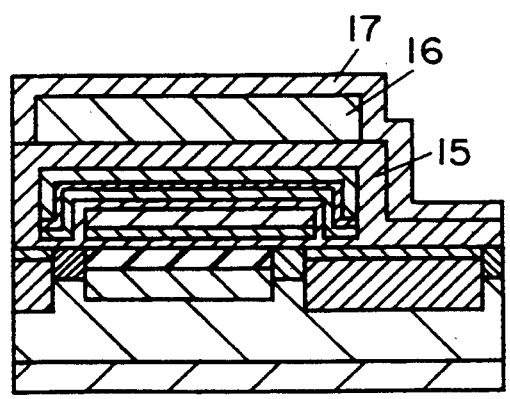

The thickness of the protective film 17 is about several hundreds of nanometers. If the thickness of the protective film 17 is larger, the light transmittance is inferior. When the light transmittance is inferior, the photo-sensitivity of the photo diode is lowered as shown in (FIG. 6D).

In this embodiment, as compared with the prior art, without much increasing the number of process steps, the smear noise may be reduced to $\frac{1}{2}$ to $\frac{1}{3}$ of the prior art.

Besides, since the silicon nitride film 22 is grown by low pressure CVD, it gets into the thin positions of the polysilicon oxide film 21 in the thin region beneath the polysilicon electrode 11 bottom end position, so that weak spots of dielectric breakdown voltage may be eliminated.

By growing the top oxide film 23 on silicon nitride film 22, pinholes in the silicon nitride film 22 are eradicated; and the dielectric breakdown voltage between the polysilicon electrode 11 and refractory metal light-shield film 14 is increased by thinning the polysilicon oxide film 21 and the silicon nitride film 22 by CVD.

In particular, the enhancement of dielectric breakdown voltage is notable in the low voltage region, and the current flowing in the nano-Amper order in the low voltage region in the prior art becomes about scores of pico-Ampere.

Supposing 0.1 $\mu$A as the judging current, the dielectric breakdown voltage is increased from the conventional value of about 50 V to about 80 V, and a high reliability has been confirmed.

Incidentally, the thickness of the silicon nitride film 22 may be freely set in a range of 10 to 100 nm depending on the desired dielectric breakdown voltage.

For example, when the thickness of the silicon nitride film 22 is increased from 100 nm to 1000 nm, the dielectric breakdown voltage between the polysilicon electrode 11 and refractory metal shield film 14 increases from 30 V to more than 100 V, and as compared with the dielectric breakdown voltage of the conventional polysilicon oxide film, the desired dielectric breakdown voltage will be obtained at a film thickness of about $\frac{1}{3}$ or less.

Thus, in the invention, since the insulation film stack of polysilicon oxide film, silicon nitride film and thermal oxide film (formed by oxidizing the surface of the silicon nitride film) is formed in the lower layer of the refractory metal light-shield film, the smear and reliability are enhanced by thinning the insulation film; thereby presenting an excellent solid-state image pickup device capable of suppressing the generation of crystal defects due to diffusion of refractory metal so as to be free from white blemish.

What is claimed:

1. A solid-state image pickup device comprising:
   a semiconductor substrate;
   a photo diode and a vertical charge coupled device (CCD) register part formed on the semiconductor substrate;
   a conductive electrode which is a driving electrode for the vertical CCD register part;
   a nitride insulation film formed over the conductive electrode;
   an oxide insulation film formed on the nitride insulation film;
   a refractory metal light-shield film formed on the oxide insulation film; and
   further comprising an oxide insulation film formed between the conductive electrode and the nitride insulation film.

2. A solid-state image pickup device according to claim 1, wherein a gate bird's beak is not formed at the bottom end portion of the conductive electrode.

3. A solid-state image pickup device according to claim 1, wherein the nitride insulation film is a silicon nitride film.

4. A solid-state image pickup device according to claim 1, wherein a gate bird's beak is not formed at a bottom end portion of the conductive electrode.

* * * * *